United States Patent
Dishongh et al.

(10) Patent No.: US 6,793,503 B2
(45) Date of Patent: Sep. 21, 2004

(54) GANGED LAND GRID ARRAY SOCKET CONTACTS FOR IMPROVED POWER DELIVERY

(75) Inventors: Terrance J. Dishongh, Hillsboro, OR (US); Weston C. Roth, Hillsboro, OR (US); Damion T. Searls, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/446,335

(22) Filed: May 27, 2003

(65) Prior Publication Data

US 2003/0207598 A1 Nov. 6, 2003

Related U.S. Application Data

(62) Division of application No. 10/106,283, filed on Mar. 26, 2002.

(51) Int. Cl.[7] ............................................... H01R 12/00
(52) U.S. Cl. ............................ 439/70; 439/83; 29/843; 29/847; 361/394; 361/400
(58) Field of Search ............................. 439/70–71, 83; 29/842–847; 361/394–400

(56) References Cited

U.S. PATENT DOCUMENTS

| | | |
|---|---|---|
| 3,951,495 A | 4/1976 | Donaher et al. |
| 4,802,860 A | 2/1989 | Kikuta |
| 5,057,904 A | 10/1991 | Nagato et al. |
| 5,221,209 A * | 6/1993 | D'Amico ...................... 439/71 |
| 5,702,256 A | 12/1997 | Severn |
| 5,800,184 A * | 9/1998 | Lopergolo et al. ............. 439/66 |
| 6,031,283 A * | 2/2000 | Banerjee et al. ............. 257/698 |
| 6,094,057 A | 7/2000 | Hiruta et al. |
| 6,168,976 B1 | 1/2001 | Haley et al. |
| 6,203,331 B1 | 3/2001 | McHugh et al. |

OTHER PUBLICATIONS

"Xilinx Fine–Pitch BGA and CSP Packages: The Technology Edge", Tech Topics Virtex, Mar. 3, 2000, pp. 1–7.
"System Design Considerations When Designing with Intel Flash", Intel Application Note 751, Jan. 2002, pp. 1–9.

* cited by examiner

*Primary Examiner*—Truc Nguyen
(74) *Attorney, Agent, or Firm*—Blakely, Sokoloff, Taylor & Zafman LLP

(57) ABSTRACT

A socket may comprise an array of first contacts and a set of second contacts having a greater conductive cross-sectional area than the first contacts. The set of second contacts may also have a greater conductive area efficiency than the array of first contacts, with conductive area efficiency defined as a total conductive cross-sectional area divided by a total occupied area. The array of first contacts may electrically couple signal pads of a land grid array (LGA) component with a plurality of signal lines in a printed circuit board (PCB). The set of second contacts may electrically couple power delivery land pads of the LGA component with power and ground planes of the PCB.

6 Claims, 14 Drawing Sheets

|  | 6x6 LGA pattern | Ganged LGA Pattern | Delta |
|---|---|---|---|
| Conductive Area (mils$^2$) | 2592 | 7632 | +194% |
| Conductive Area Efficiency | 5.7% | 16.9% | +196% |
| Resistance (m Ω) | 0.020 | 0.007 | -65% |

FIG. 6

GANGED LAND GRID ARRAY SOCKET CONTACTS FOR IMPROVED POWER DELIVERY

This is a Divisional application of Ser. No.: 10/106,283 filed Mar. 26, 2002, which is presently pending.

FIELD

Embodiments of the present invention relate to the field of sockets for coupling integrated circuit components to printed circuit boards, particularly to sockets having separate geometries for power delivery and signal contacts.

BACKGROUND

Sockets are frequently used to connect an integrated circuit (IC) component to a printed circuit board (PCB) rather than soldering the IC component directly to the PCB. Use of sockets may enable major computer system components, such as microprocessors, to be easily inserted, removed, and replaced. Sockets may be particularly useful in cases in which a computer system may be upgraded by removing a microprocessor and replacing it with a higher performing microprocessor without having to replace the entire computer system. Some of the latest microprocessors are packaged in land grid array (LGA) packages that have an array of land pads on a bottom surface of the package.

An LGA socket soldered to a PCB may have an array of contacts corresponding to the array of land pads for electrically coupling an LGA component with the PCB. Typically, a certain number of contacts are allocated for power delivery to the LGA component. For example, FIG. 1 illustrates a top view of an exemplary pattern of contacts 102 allocated for power delivery. As illustrated, alternating contacts may be coupled with power and ground. Typically, the contacts allocated for power delivery have the same geometry (i.e. size, shape and spacing) as the rest of the contacts in the array, which may be used for signals.

However, as high performance processors consume increasing levels of power and current, limitations to power delivery may occur due to electrical resistance of the contacts. Increased current density through the contacts may create self-heating which may further increase contact resistance and limit power delivery to the LGA component. A current approach to reduce current density through the contacts of an LGA socket is to allocate a greater number of contacts for power delivery. However, allocating a greater number of contacts for power delivery may reduce the number of contacts available for signals.

BRIEF DESCRIPTION OF THE DRAWINGS

FIG. 6 is a table illustrating conductive area efficiency for different power delivery contact patterns.

DETAILED DESCRIPTION

In the following description, numerous specific details are set forth such as material types and ranges, in order to provide a thorough understanding of specific embodiments of the present invention. However, it will be obvious to one of skill in the art, that embodiments of the present invention may be practiced without these specific details. In other instances, well-known elements and processing techniques have not been shown in particular detail in order to avoid unnecessarily obscuring the understanding of this description.

Embodiments of the present invention reduce current density through socket contacts by using separate geometries for signal and power delivery contacts. For example, a standard array of individual contacts may be used for signals while a set of ganged contacts may be used for power delivery. The set of ganged contacts may provide a larger conductive cross-sectional area for current to pass compared to the standard array of individual contacts typically used for power delivery, which may result in lower contact resistance and operating temperature. The term ganged contacts may refer to contacts having a greater conductive cross-sectional area than other contacts, such as a individual contacts of a standard array.

An Exemplary Socket

Figure 2:
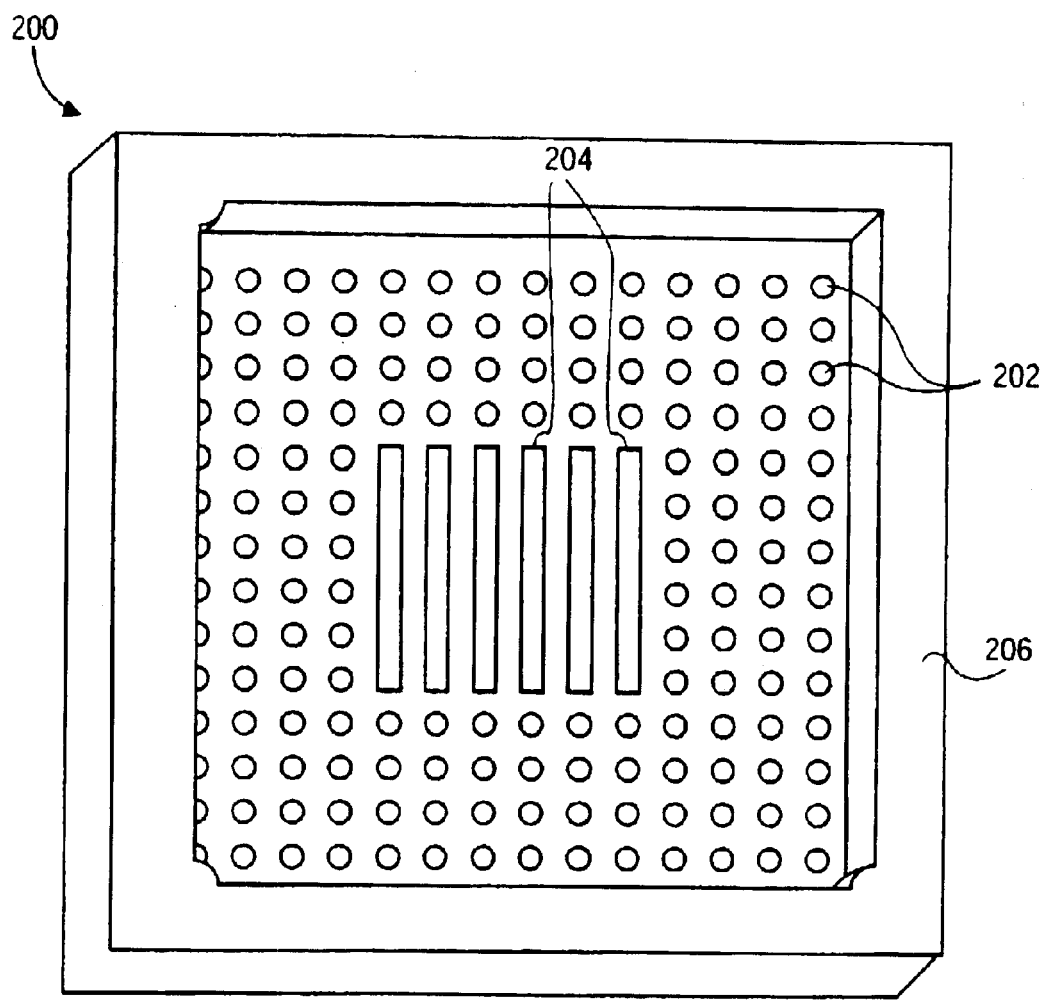
FIG. 2 illustrates a top view of an exemplary socket according to one embodiment of the present invention.

FIG. 2 illustrates a top view of an exemplary socket 200 having a set of individual contacts 202 and a set of ganged contacts 204 formed in a socket body 206 in accordance with one embodiment of the present invention. The socket body 206 may be formed of a non-conductive material, such as a plastic, suitable for housing the individual contacts 202 and ganged contacts 204. The socket body 206 may have a top surface for receiving an integrated circuit (IC) component and a bottom surface adapted to be coupled to a printed circuit board. The socket body 206 may also include a retention device, such as a socket lid or clip, to retain a mounted IC component.

As illustrated, the individual contacts 202 may be formed as an array. However, for other embodiments of the present invention, individual contacts 202 may be formed in another pattern, for example, to match a corresponding land pattern of an IC component. The individual contacts 202 and ganged contacts 204 may be designed to engage corresponding terminals (land pads, solder balls, etc.) of an IC component mounted in the socket 200. For example, the individual contacts 202 may engage corresponding land pads used to carry signals to and from a land grid array (LGA) component, while the ganged contacts 204 may engage corresponding land pads used to deliver power to the LGA component. Therefore, the array of individual contacts 202 may have a pitch corresponding to a standard LGA pitch, such as 0.5 mm, 0.6 mm, 0.75 mm, 0.8 mm, 1.0 mm, or 1.27 mm.

The individual contacts 202 and ganged contacts 204 may be formed of any suitable conductive material, such as copper, silver, a tin plated material, or a gold plated material. The array of individual contacts 202 and the set of ganged contacts 204 may be arranged in any suitable pattern in any suitable relationship to each other. As illustrated, for some embodiments of the present invention, the array of individual contacts 202 may extend around the set of ganged contacts 204. The set of ganged contacts 204 may occupy a M×N portion of the array, with M and N being integers. Further, each ganged contact 204 may occupy a 1×N portion of the array, with N being greater than 1. For example, the set of ganged contacts 204 may occupy a 6×6 portion of the array, with each ganged contact 204 occupying a 1×6 portion of the array.

Figure 3:
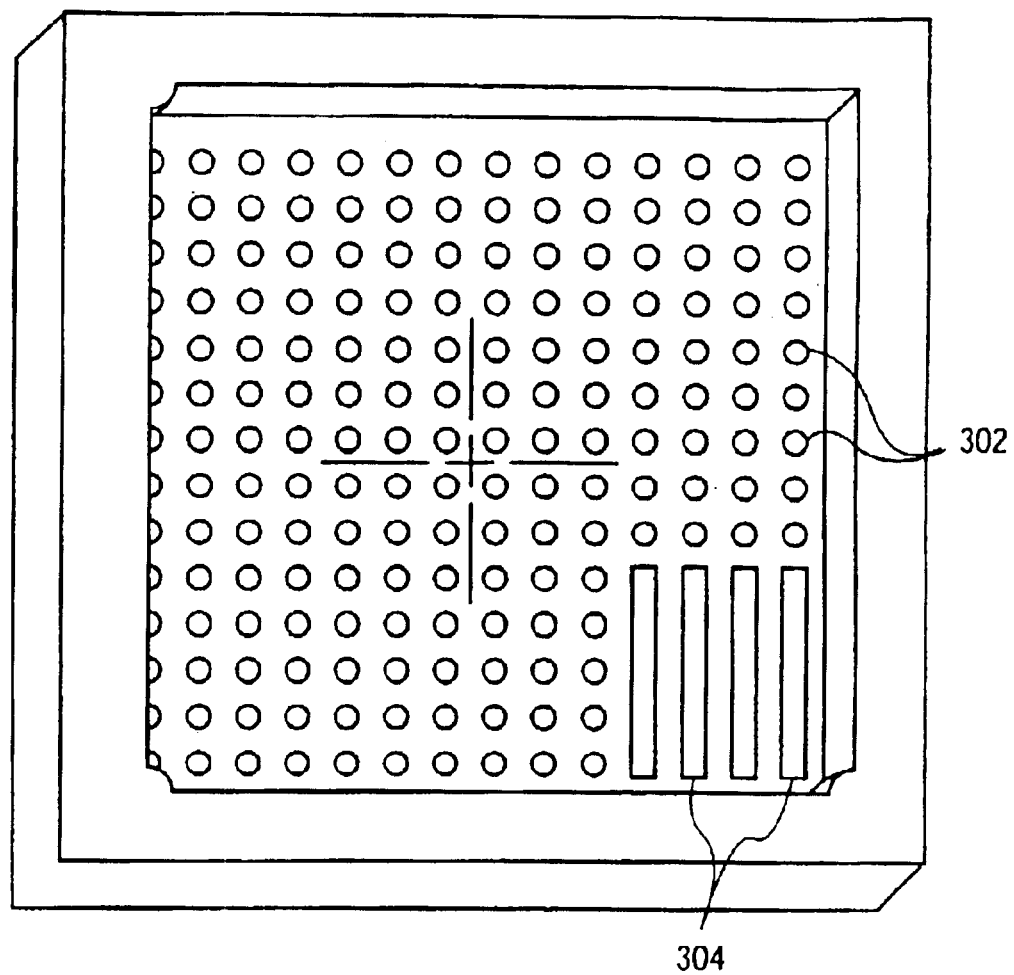
FIG. 3 illustrates a top view of an exemplary socket according to another embodiment of the present invention.
Figure 4:
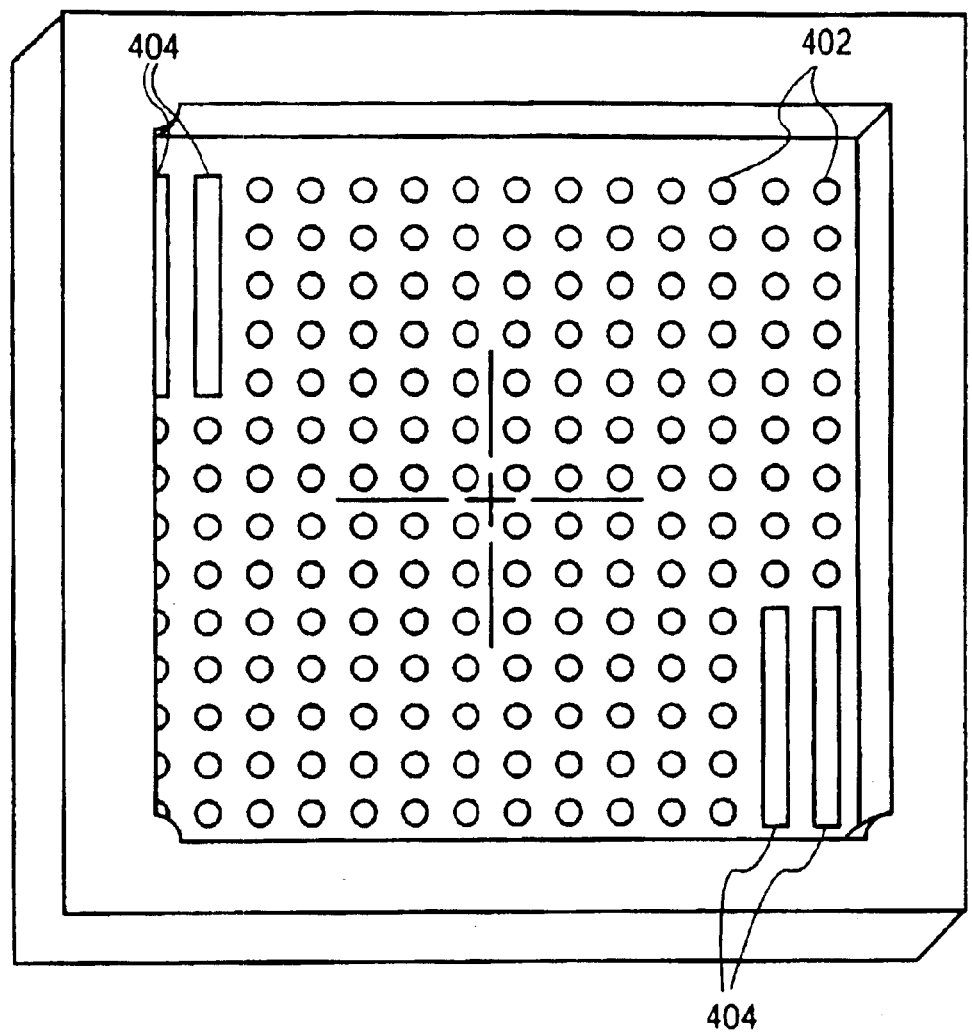
FIG. 4 illustrates a top view of an exemplary socket according to still another embodiment of the present invention.

For other embodiments of the present invention, as illustrated in FIG. 3, a set of ganged contacts 304 may be formed in a perimeter portion of an array of individual contacts 302. Further, as illustrated in FIG. 4, for some embodiments of the present invention, more than one set of ganged contacts 404 may be formed at various locations within an array of individual contacts 402.

Exemplary Ganged Contact Patterns

A total resistance R through a set of contacts may be determined by the following equation:

$$R=(\rho \times H)/A$$

where $\rho$ is a bulk resistivity of the contact material, H is a height of the contacts, and A is a total conductive cross-sectional area of the set of contacts. Therefore, by increasing the total conductive cross-sectional area, the total resistance of the set of contacts may be reduced. For some embodiments of the present invention, a set of ganged contacts, each having a greater conductive cross-sectional area than an individual contact, may have a greater conductive area efficiency compared to a standard array of individual contacts. Conductive area efficiency for a set of contacts may be defined as a total conductive cross-sectional area of the set of contacts divided by a total cross-sectional area occupied by the set of the contacts.

Figure 5:
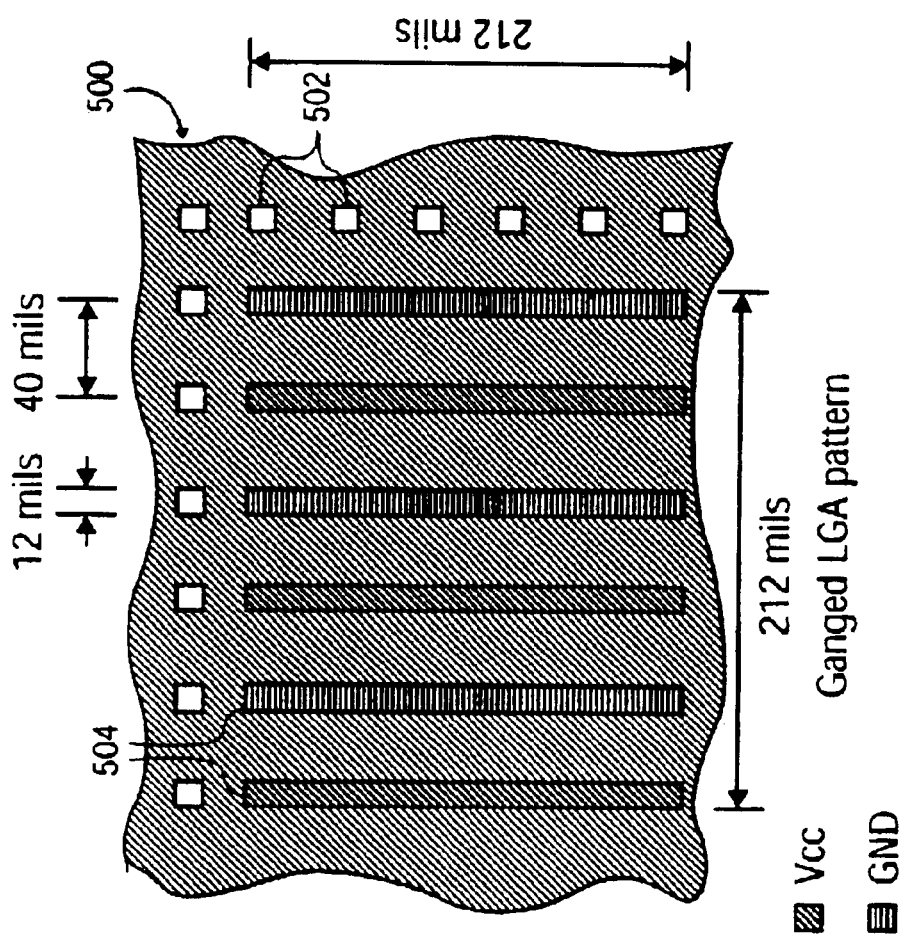
FIG. 5 illustrates an exemplary power delivery contact pattern according to one embodiment of the present invention.

For example, FIG. 5 illustrates a detailed view of a set of ganged contacts 504, similar in pattern to the set of ganged contacts 204 of FIG. 2. The set of ganged contacts 504 may occupy a total cross-sectional area equal to the standard array of individual contacts illustrated in FIG. 1, 212×212 mils$^2$. As illustrated, alternating ganged contacts 504 may be allocated between power (i.e. Vcc, Vdd, etc.) and ground. Therefore, a total conductive cross-sectional area for current flow through the ganged contacts 504 may be 3×12×212 (7,632) mils$^2$. Alternatively, the total conductive cross-sectional area for current flow through the standard array of individual contacts 102 of FIG. 1 maybe 18×12×12 (2,592) mils$^2$.

Figure 1:
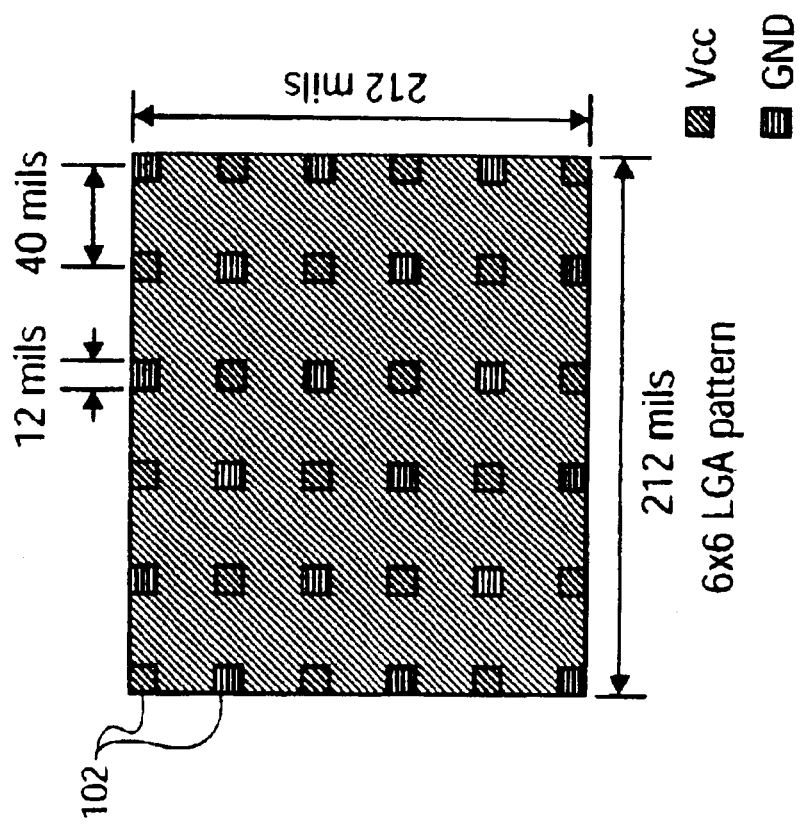
FIG. 1 illustrates a land grid array (LGA) contact pattern for power delivery according to the prior art.

FIG. 6 illustrates a table comparing conductive area density and overall resistance of the pattern of ganged contacts 504 illustrated in FIG. 5 versus the standard array of individual contacts 102 illustrated in FIG. 1. The table assumes ganged contacts 504 and individual contacts 102 each have a height of 80 mils and are made of copper having a bulk resistivity $\rho$ of 0.6653 mΩ-mil. As illustrated, while the array of individual contacts may have a conductive area efficiency less than 6%, the pattern of ganged contacts 504 may have a conductive area efficiency greater than 15%. The pattern of ganged contacts 504 may, therefore, exhibit an approximate two-fold increase in conductive cross-sectional area which may corresponds to an approximate 65% reduction in total contact resistance when compared with the standard array of individual contacts 102 illustrated in FIG. 1. It may be appreciated, however, that the results may vary with contact dimensions and array pitch.

Figure 7:
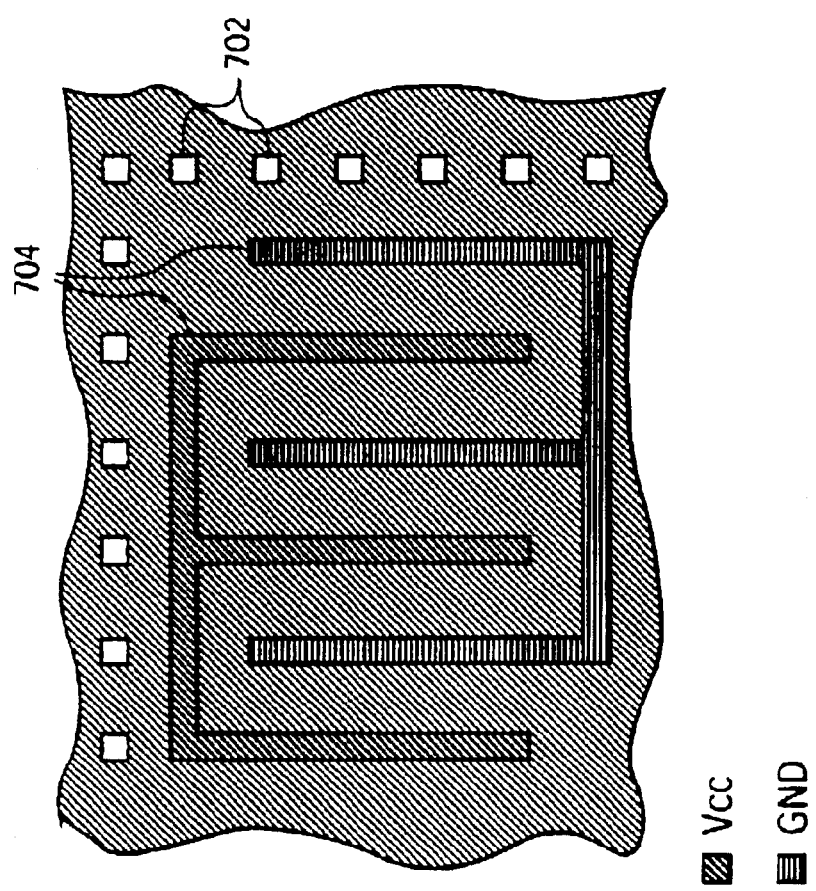
FIG. 7 illustrates an exemplary power delivery contact pattern according to another embodiment of the present invention.
Figure 8:
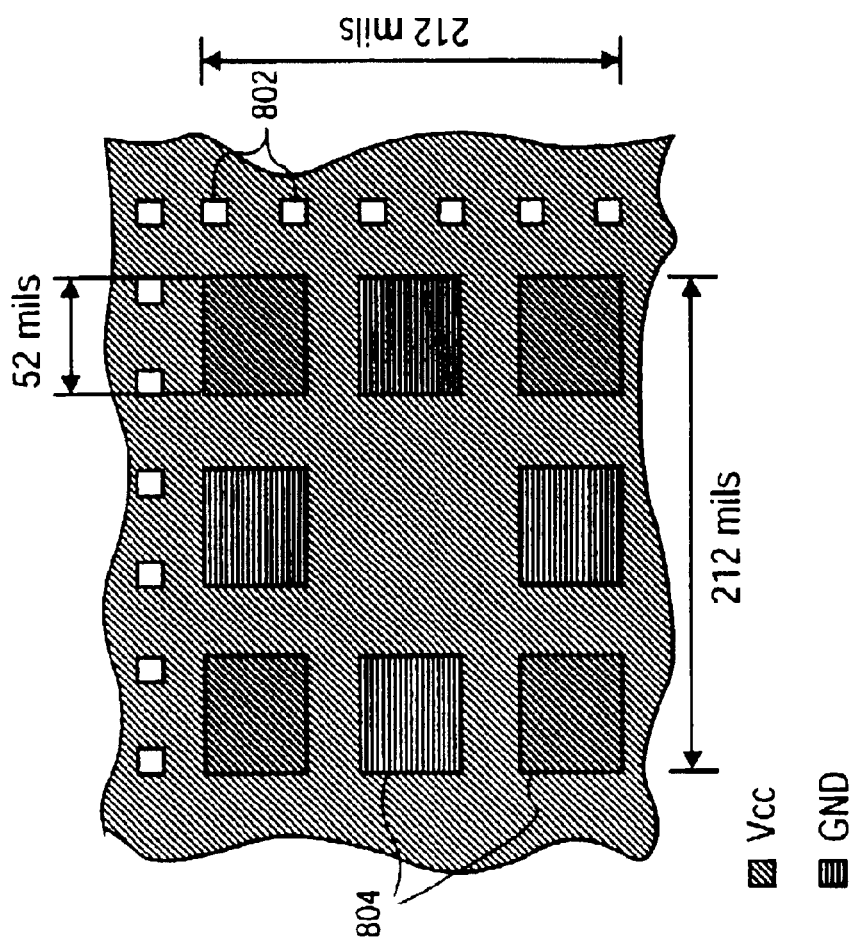
FIG. 8 illustrates an exemplary power delivery contact pattern according to still another embodiment of the present invention.

It may also be appreciated that while FIGS. 1 and 5 illustrate contacts having square and rectangular cross-sectional areas, respectively, individual and ganged contacts may be any suitable shape. Further, various other patterns and geometries of ganged contacts may also have an increased conductive area efficiency when compared to a standard array of contacts. As an example, FIG. 7 illustrates ganged contacts 704 formed as a pattern of inter-locking E's within an array of individual contact 702. As another example, FIG. 8 illustrates ganged contacts 804, each occupying a 2×2 portion of an array of individual contacts 802. For some embodiments of the present invention, a set of individual contacts having a finer pitch than a standard array used for signals may also have an increased conductive area efficiency and may be used for power delivery.

An Exemplary System

Referring back to FIG. 2, the socket 200 may be attached to a socket attach region of a printed circuit board (PCB) which may include a pattern of solder pads corresponding to the pattern of socket contacts. For some embodiments of the present invention, the socket attach region may include an array of first solder pads to electrically couple the array of individual contacts 202 with a plurality of signal traces and a set of second solder pads to electrically couple the set of ganged contacts with conductive planes, such as power and ground planes.

Figure 9:
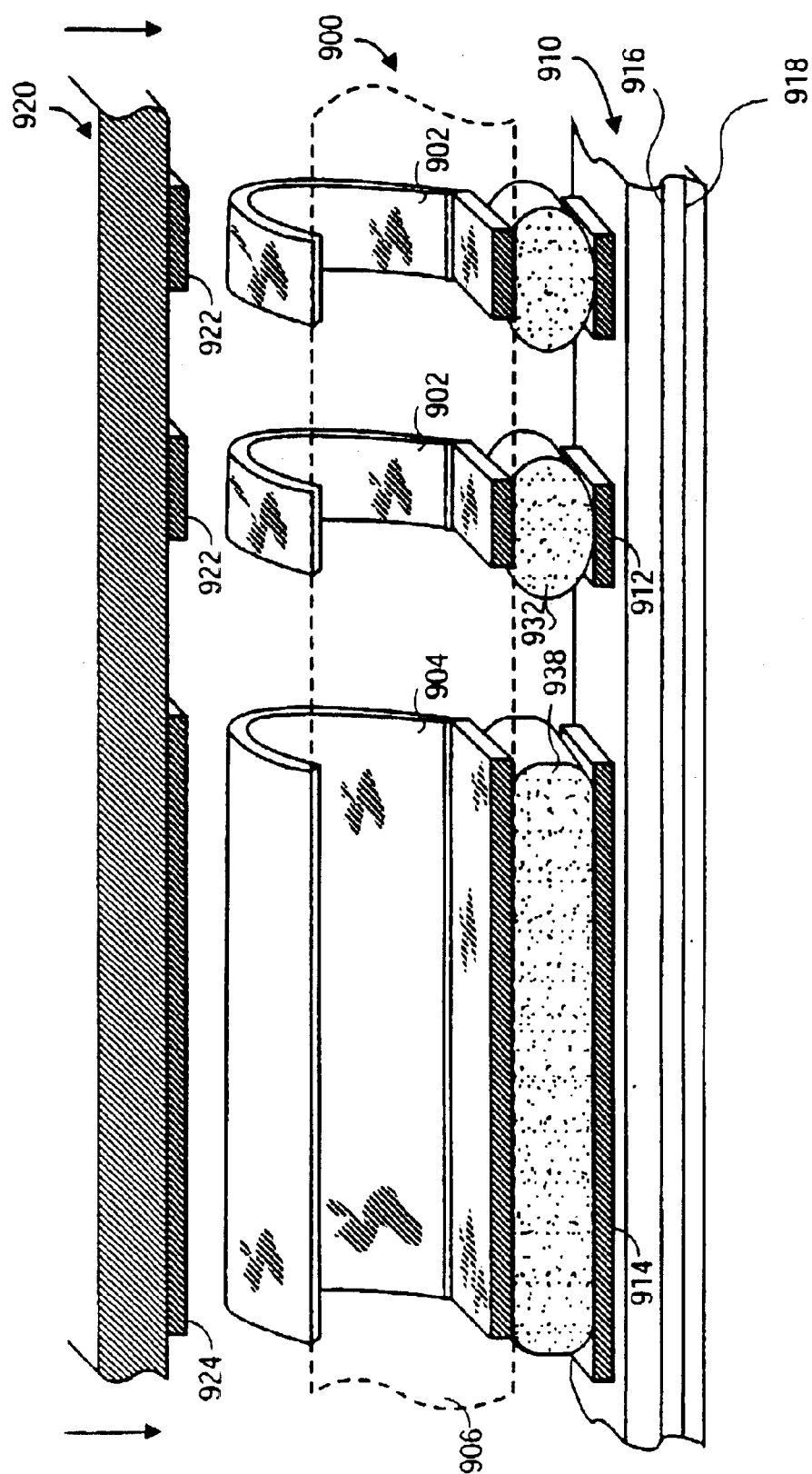
FIG. 9 illustrates an exemplary system according to one embodiment of the present invention.

For example, FIG. 9 illustrates an exemplary system comprising a socket 900 attached to a PCB 910. The socket 900 may have an array of individual contacts 902 formed in a socket body 906 to electrically couple a corresponding array of individual land pads 922 of an LGA component 920 mounted in the socket 900 to a plurality of signal lines on the PCB 910. The socket 900 may also have a set of ganged contacts, such as ganged contact 904, to electrically couple a set of land pads used to deliver power to the LGA component 920 to a plurality of conductive planes within the PCB 910, such as a power plane (i.e. Vcc) 916 and a ground plane (i.e., Vss) 918. For some embodiments of the present invention, the LGA component 920 may have a set of ganged land pads, such as ganged land pad 924 for power delivery. As illustrated, the ganged land pad 924 may have a greater conductive cross-sectional area than the individual land pads 922.

The LGA component 920 may be any suitable LGA component such as a processor, a memory or a chipset. For some embodiments of the present invention, the PCB 910 may be a motherboard of a computer system and the LGA component 920 may be a processor. Therefore, the array of individual land pads 922 may be used to carry input/output (I/O) signals to and from the processor, such as data and address signals, while ganged land pads may be used for power (Vcc) and ground (Vss). As illustrated, the individual contacts 902 and ganged contacts 904 may have a shape designed to exert an upward force to engage the individual land pads 922 and ganged land pads, respectively, as the LGA component 920 is mounted in the socket 900.

The individual contacts 902 may be electrically coupled with an individual solder pad 912 by a solder ball 932, while the ganged contact 904 may be electrically coupled with a ganged solder pad 914 by a ganged solder interconnection 938. For some embodiments of the present invention, the ganged solder pad 914 may comprise a strip of conductive material, such as copper, substantially equal in length to the ganged contact 904. Similarly, the ganged solder interconnection 938 may comprise a strip of solder substantially equal in length to the ganged contact 904. The ganged solder interconnection 938 may be formed by any suitable method.

Figure 10:
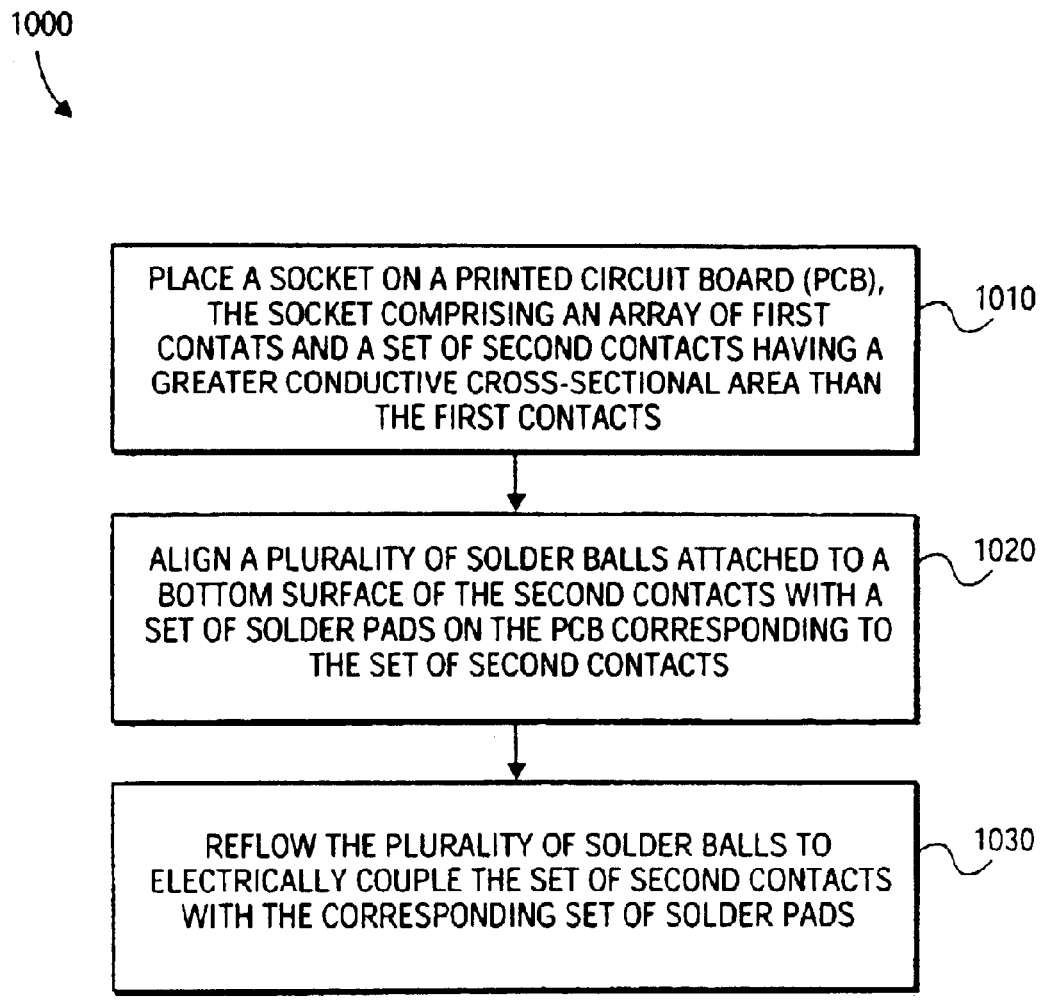
FIG. 10 is a flow diagram illustrating exemplary operations of a method according to one embodiment of the present invention.

For example, FIG. 10 is a flow diagram 1000 illustrating exemplary operations of a method for attaching a socket to a PCB that may result in ganged solder interconnections. For block 1010, a socket is placed on a PCB, the socket comprising an array of first contacts and a set of second contacts having a greater conductive cross-sectional area than the first contacts. For block 1020, a plurality of solder balls attached to a bottom surface of the second contacts is aligned with a set of solder pads on the PCB corresponding to the second set of contacts.

Figure 11A:
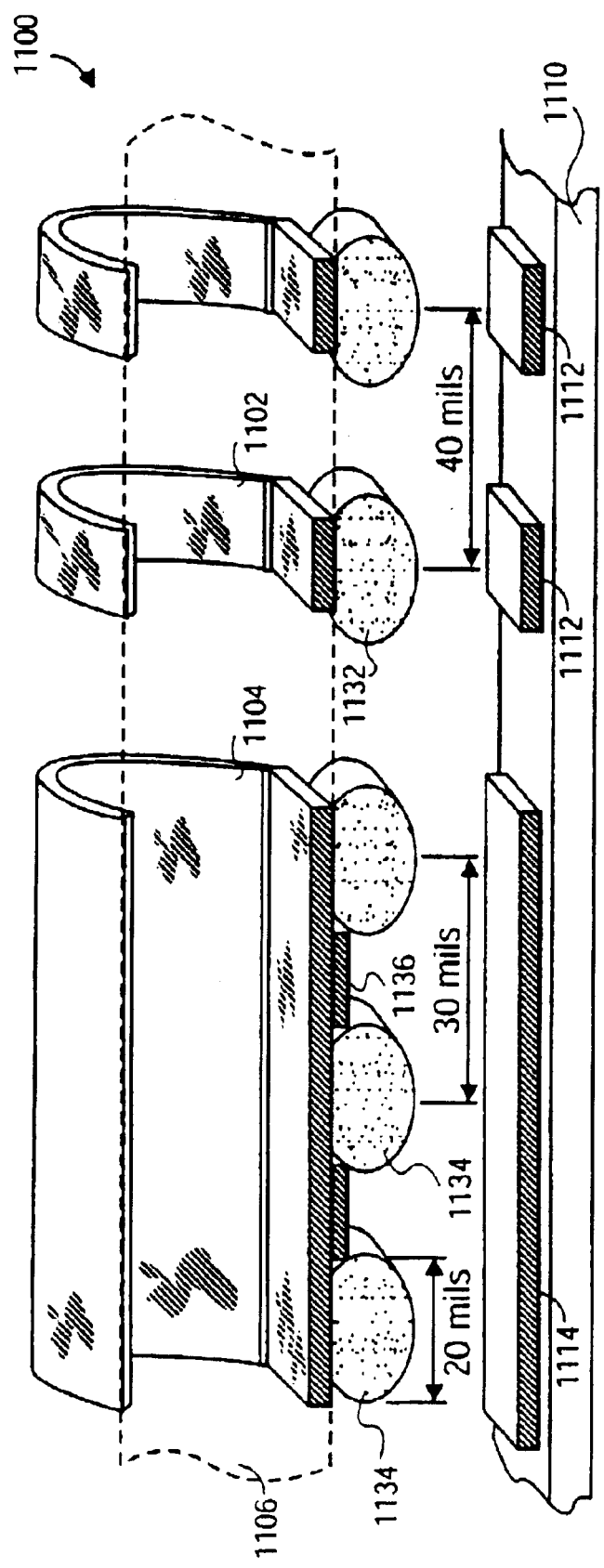
FIGS. 11A and 11B illustrate an exemplary socket according to one embodiment of the present invention.

For example, FIG. 11A illustrates an exemplary socket 1100 having a ganged contact 1104 and individual contacts 1102 formed in a socket body 1106. The ganged contact 1104 may be one of a set of ganged contacts formed within an array of individual contacts 1102. A plurality of solder balls 1134 attached to a bottom surface of the ganged contact 1104 may be separated by a solder mask material 1136. The solder mask material 1136 may prevent adjacent solder balls 1134 from wicking together during a reflow attachment process. The solder balls 1134 may be made of any suitable type solder, such as a common lead-tin alloy or, alternatively, a lead-free solder.

Figure 11B:
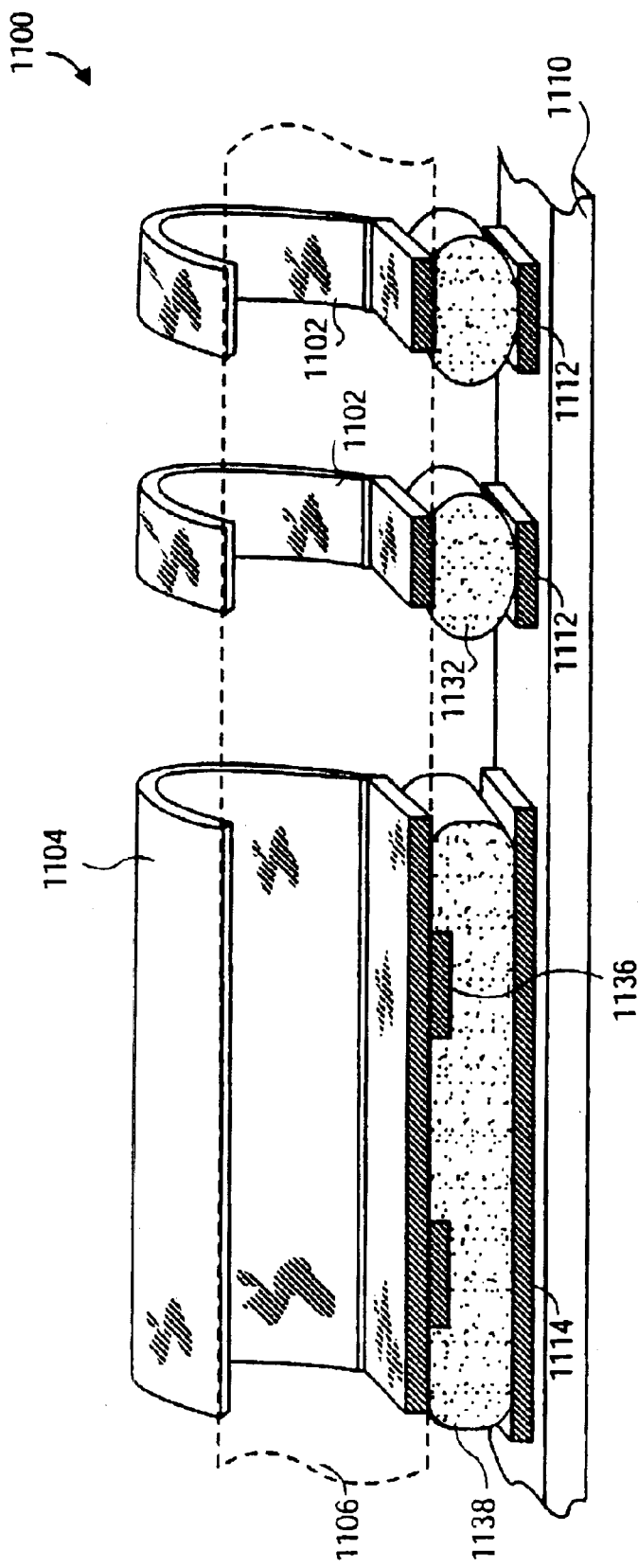

For block 1030, the plurality of solder balls are reflowed to electrically couple the set of second contacts with the corresponding set of solder pads. For example, the socket 1100 and PCB 1110 may be run through a reflow oven. As illustrated in FIG. 11B, upon reflow the solder balls 1134 may flow together to form a single ganged solder interconnection 1138 between the ganged contact 1104 and the ganged solder pad 1114.

The solder balls 1134 may be substantially equal in dimension to solder balls 1132 attached to a bottom surface of individual contacts 1102. To ensure the solder balls 1134 flow together to form a single ganged solder interconnection, the solder balls 1134 may be attached with a narrower pitch than solder balls 1132 attached to individual contacts. For example, if the array of individual contacts 1102 has a pitch 40 mils, solder balls 1134 having a diameter of 20 mils may be attached to the ganged contact 1104 with a pitch of 30 mils.

Figure 12A:
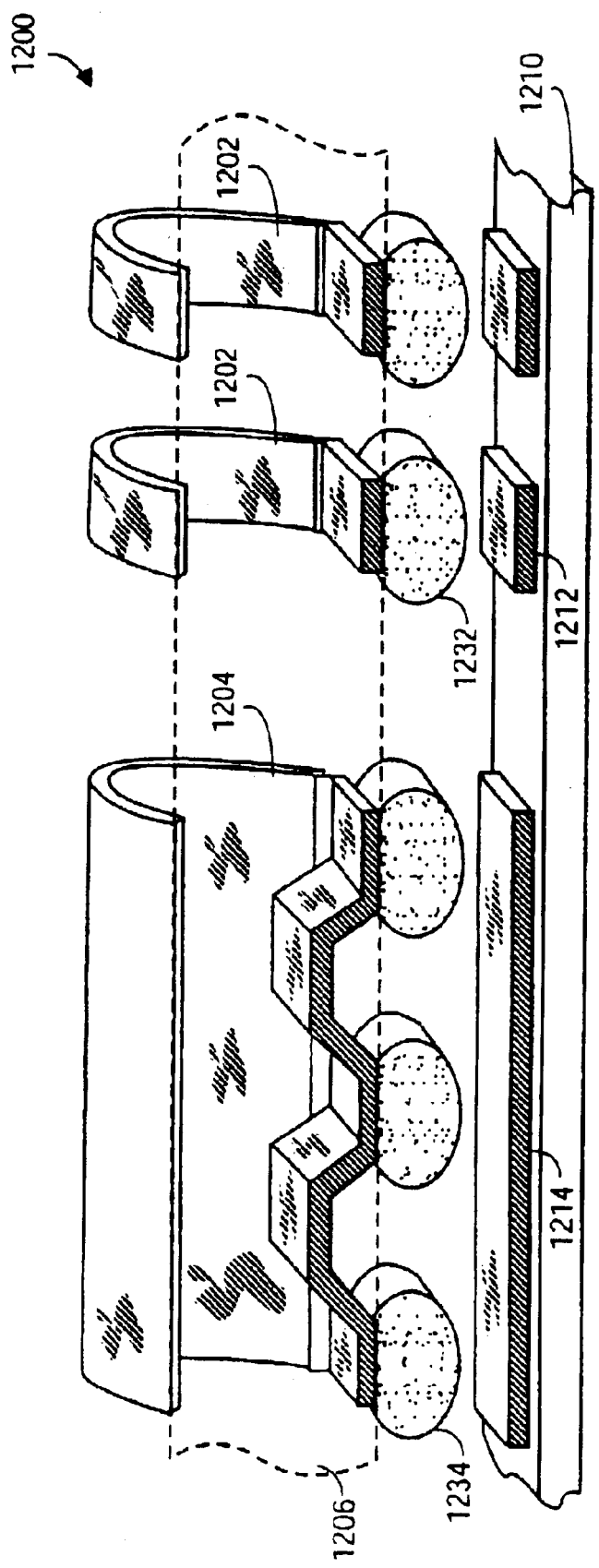
FIGS. 12A and 12B illustrate an exemplary socket according to another embodiment of the present invention.
Figure 12B:
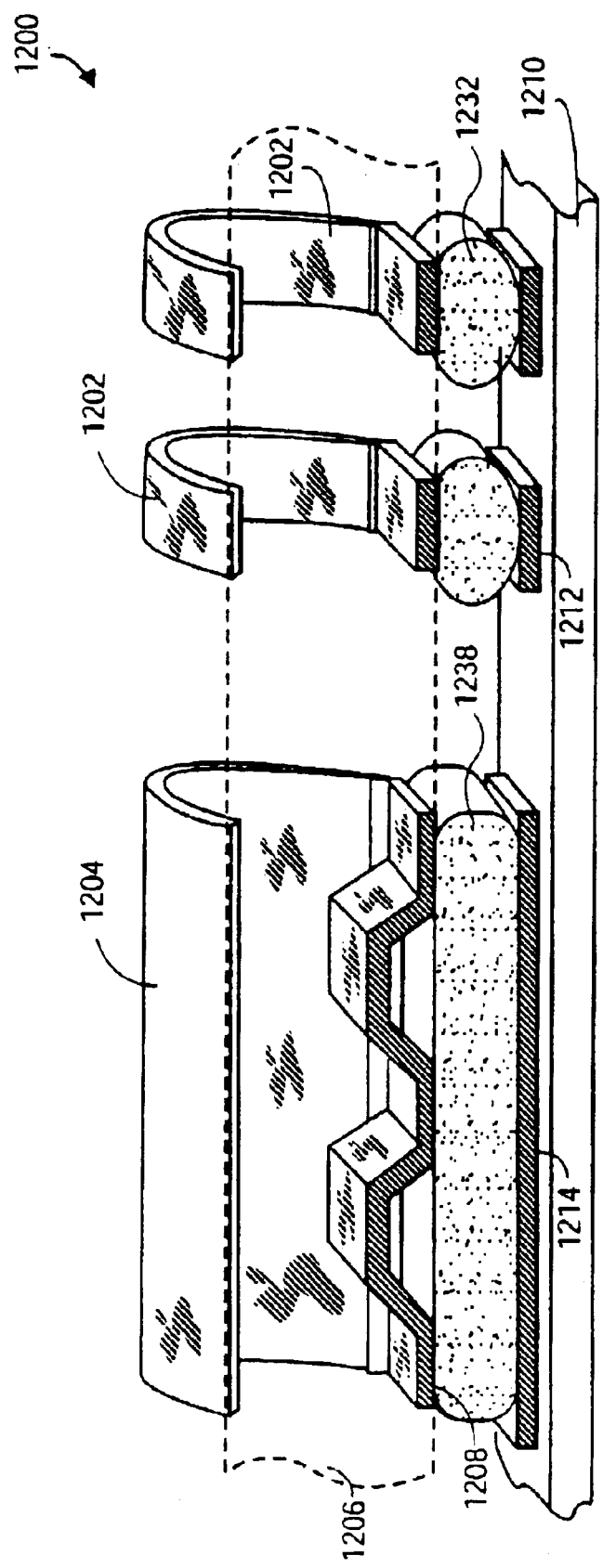

FIGS. 12A and 12B illustrate an exemplary socket 1200 having a ganged contact 1204 and an individual contacts 1202 formed in a socket body 1206 according to another embodiment of the present invention. The ganged contact 1204 may have a crenellated bottom surface with solder balls 1234 attached to substantially flat bottom portions 1208. As illustrated in FIG. 12B, the solder balls 1234 may flow together upon reflow to form a single ganged solder interconnection 1238.

The crenellated bottom surface may be designed to ensure the solder balls 1234 have a sufficiently narrow pitch to flow together upon reflow. While the ganged solder interconnection 1238 may not come in electrical contact with a top portion of the crenellated bottom surface, the ganged contact 1204 may still provide a larger conductive cross-sectional area for current flow which may reduce overall current density through the socket 1200.

In the foregoing description, the invention has been described with reference to specific exemplary embodiments thereof. It will, however, be evident that various modifications and changes may be made thereto without departing from the broader spirit or scope of the appended claims. The specification and drawings are, accordingly, to be regarded in an illustrative rather than a restrictive sense.

What is claimed is:

1. A method comprising:

placing a socket on a printed circuit board (PCB), the socket comprising an array of first contacts and a set of second contacts having a greater conductive cross-sectional area than the first contacts, wherein the greater conductive cross-sectional area of each contact of the set of second contacts is coplanar with each contact of the set of first contacts;

aligning a plurality of solder balls attached to a bottom surface of each second contact with a set of solder pads on the PCB corresponding to the set of second contacts, each of the contacts of the set of second contacts formed to provide a pressure contact with respective corresponding solder pads of the set of solder pads solder pads on the PCB, the pressure contact of each of the contacts of the set of second contacts occurring on the greater conductive cross-sectional area to provide greater power delivery; and reflowing the plurality of solder balls to electrically couple the set of second contacts with the corresponding set of solder pads.

2. The method of claim 1, wherein the plurality of solder balls flow together upon reflow to form a single solder interconnection between each second contact and a corresponding solder pad.

3. The method of claim 1, wherein the plurality of solder balls are attached to a bottom surface of each second contact with a narrower pitch than the array of first contacts.

4. The method of claim 1, wherein the array of first contacts has a pitch of 0.040 inches or less and the solder balls are attached to a bottom surface of each second contact with a pitch of 0.030 inches or less.

5. The method of claim 1, further comprising mounting a land grid array (LGA) component in the socket.

6. The method of claim 5, wherein the LGA component is a processor and the array of first contacts engages a corresponding array of signal land pads on a bottom surface of the processor and the set of second contacts engages a set of power delivery land pads on the bottom surface of the processor.

* * * * *